(12) United States Patent
Misra et al.

(10) Patent No.: US 6,984,685 B2
(45) Date of Patent: Jan. 10, 2006

(54) THERMAL INTERFACE PAD UTILIZING LOW MELTING METAL WITH RETENTION MATRIX

(75) Inventors: Sanjay Misra, Shoreview, MN (US); Radesh Jewram, Lakeville, MN (US); G M Fazley Elahee, Woodbury, MN (US)

(73) Assignee: The Bergquist Company, Chanhassen, MN (US)

( * ) Notice: Subject to any disclaimer, the term of this patent is extended or adjusted under 35 U.S.C. 154(b) by 498 days.

(21) Appl. No.: 10/279,593

(22) Filed: Oct. 24, 2002

(65) Prior Publication Data

US 2003/0187116 A1 Oct. 2, 2003

Related U.S. Application Data

(63) Continuation-in-part of application No. 09/946,879, filed on Sep. 5, 2001, now Pat. No. 6,797,758, which is a continuation-in-part of application No. 09/690,994, filed on Oct. 17, 2000, now Pat. No. 6,624,224, which is a continuation-in-part of application No. 09/543,661, filed on Apr. 5, 2000, now Pat. No. 6,339,120.

(51) Int. Cl.
*C08K 3/10* (2006.01)

(52) U.S. Cl. ............... 524/439; 524/434; 428/116; 428/117; 428/118; 428/131; 428/134; 428/137; 428/138; 418/418; 418/423.1; 418/423.3; 418/425.8; 418/450

(58) Field of Classification Search ............... 524/404, 524/434, 439; 428/116, 117, 118, 131, 134, 428/137, 138, 418, 423.1, 423.3, 425.8
See application file for complete search history.

(56) References Cited

U.S. PATENT DOCUMENTS

| | | |
|---|---|---|
| 3,226,608 A | 12/1965 | Coffin, Jr. |
| 3,248,615 A | 4/1966 | Weisshaar et al. |
| 4,129,881 A | 12/1978 | Reichel et al. |
| 4,147,669 A | 4/1979 | Shaheen et al. |
| 4,233,103 A | 11/1980 | Shaheen |
| 4,254,431 A | 3/1981 | Babuka et al. |
| 4,323,914 A | 4/1982 | Berndlmaier et al. |
| 4,398,975 A | 8/1983 | Ohsawa et al. |
| 5,012,858 A | 5/1991 | Natori et al. |
| 5,024,264 A | 6/1991 | Natori et al. |
| 5,053,195 A | 10/1991 | McKay |
| 5,056,706 A | 10/1991 | Dolbear et al. |
| 5,170,930 A | 12/1992 | Dolbear et al. |
| 5,173,256 A | 12/1992 | Booth et al. |
| 5,198,189 A | 3/1993 | Booth et al. |
| 5,225,157 A | 7/1993 | McKay |
| 5,328,087 A | 7/1994 | Nelson et al. |
| 5,445,308 A | 8/1995 | Nelson et al. |
| 5,950,066 A | 9/1999 | Hanson et al. |
| 6,015,722 A | 1/2000 | Banks |
| 6,165,612 A * | 12/2000 | Misra .................. 428/344 |
| 6,339,120 B1 * | 1/2002 | Misra et al. ............ 524/404 |
| 6,399,209 B1 | 6/2002 | Misra et al. |
| 6,624,224 B1 * | 9/2003 | Misra .................. 524/404 |
| 6,797,758 B2 * | 9/2004 | Misra et al. ............ 524/404 |

FOREIGN PATENT DOCUMENTS

EP 1143511 10/2001

OTHER PUBLICATIONS

IBM Technical Disclosure Bulletin, vol. 19, #8, Jan. 1977 "Thermal Enchancement of Modules", E.H. Hultmark et al.
IBM Technical Disclosure Bulletin, vol. 20, #11B, Apr. 1978 "Electronic Packaging Structure", Arnold et al. pp. 4820-4822.
IBM Tech. Discl. Bull., vol. 20, #11B, Apr. 1978, "Liquid-Metal-Cooled Integrated Circuit Module Structures", Berndlmaier et al. pp. 4817-4818.
Harman, "Hard Gallium Alloys for Use as Low Contact Resistance Electrodes and for Bonding Thermocouples into Samples", The Review of Scientific Instruments, Jul. 1960, vol. 31, No. 7, pp. 717-720.
IEEE Transactions on Components, Hybrids, and Mfg. Tech., vol. 13, #4, Dec. 1990 "Materials/Processing Approaches to Phase Stabilization of Thermally Conductive Pastes", Anderson, Jr., et al., pp. 713-717.

* cited by examiner

*Primary Examiner*—Edward J. Cain
(74) *Attorney, Agent, or Firm*—Haugen Law Firm PLLP

(57) ABSTRACT

A stabilized thermally conductive mechanical compliant laminate pad to be interposed between opposed surfaces of a generating semi-conductor device and a heat sink, with the laminate pad comprising upper and lower laminae on opposed surfaces of a central stabilizing apertured grid. The laminae are subjected to a compressive force at an elevated temperature until portions of the laminae extend through the apertures to form a continuum. The laminae comprise a polymer matrix having a quantity of a low melting indium or gallium alloy and a thermally conductive particulate dispersed there through, with the polymer matrix being a hot wax or melt resin. With the upper and lower laminae positioned on opposed surfaces of a central stabilizing apertured grid a compressive load is applied to force portions of said laminae to pass through apertures in the mesh grid to form a continuum.

6 Claims, 5 Drawing Sheets

THERMAL INTERFACE PAD UTILIZING LOW MELTING METAL WITH RETENTION MATRIX

CROSS-REFERENCE TO RELATED APPLICATIONS

This application is a continuation-in-part of our application Ser. No. 09/946,879, filed Sep. 5, 2001 now U.S. Pat. No. 6,797,758, entitled "MORPHING FILLERS AND THERMAL INTERFACE MATERIALS"; which application Ser. No. 09/946,879 was a continuation-in-part of our prior application Ser. No. 09/690,994, filed Oct. 17, 2000 now U.S. Pat. No. 6,624,224, entitled "METHOD OF PREPARING THERMALLY CONDUCTIVE COMPOUNDS BY LIQUID METAL BRIDGED PARTICLE CLUSTERS", which application Ser. No. 09/690,994 is a continuation-in-part application of our parent application Ser. No. 09/543,661, filed Apr. 5, 2000 now U.S. Pat. No. 6,339,120, entitled "METHOD OF PREPARING THERMALLY CONDUCTIVE COMPOUNDS BY LIQUID METAL BRIDGED PARTICLE CLUSTERS", now U.S. Pat. No. 6,339,120, all of which are assigned to the same assignee as the present application.

BACKGROUND OF THE INVENTION

The present invention relates generally to an improved mechanically stabilized thermally conductive interface pad for transferring thermal energy from a heat generating semiconductor device to a heat dissipator such as a heat sink or heat spreader. More specifically, the present invention relates to such an interface which comprises a laminate pad with upper and lower thermally conductive laminae positioned upon and extending through apertures from opposed surfaces of an open mesh grid. In other words, portions of each of the opposed laminae extend through apertures in the stabilizing mesh grid to form a continuum, thus enhancing both mechanical stability and heat transfer efficiency without the creation of additional thermal interfaces.

The upper and lower laminae preferably comprise formulations of highly thermally conductive polymer compounds such as a polymeric matrix loaded or filled with solid particulate and a liquid or low melting point metal. It will be understood that the term "liquid metal" is intended to refer to a metal or alloy having a melting point which is generally below about 90° C., although some higher melting materials may be included in the definition. The solid particulate typically forms clusters which become coated with the low melting metal and are distributed throughout the matrix. The arrangement of the present invention further provides for extrusion or oozing of portions of the loaded polymer laminae through the grid apertures. Extrusion through these apertures is achieved through application of heat and pressure to a laminae/mesh grid preform which causes the opposed laminae surfaces to merge and create a continuum of the loaded polymer. Accordingly, the continuum creates a mechanically stabilized composite thermally conductive pad which is formed without creation of additional large thermal barriers or interfaces extending along and across the thermal path. As a result, enhanced mechanical stability is achieved without sacrificing valuable properties such as high thermal conductivity and mechanical compliance.

Liquid metals as well as thermally conductive particulate have each been proposed for incorporation in a polymeric matrix to form thermally conductive interface pads. In the past however, the application of liquid metals for this purpose had not been widely used, primarily because of problems created instability and/or tendency of the liquid metal to oxidize or form alloys and amalgams, thereby altering and modifying the physical properties of the liquid metal component in the pad. In certain arrangements, the liquid metal component would become oxidized, both along the surface as well as in the bulk structure. By way of example, dispersed liquid metal droplets had a tendency to coalesce, a process known as Ostwald ripening, and cause macroscopic separation of the metal from the polymer matrix. In addition the oxidation of the liquid metal was sometimes accelerated upon exposure to warm and/or humid environments; this leading to the formation of brittle oxides which reduced the effectiveness of the thermal properties of the compound. Finally, while some highly thermally conductive components of prior art devices are typically electrically conductive, this property may not always be undesirable. Instability of liquid metals was believed due at least in part to the extremely high surface tension and other chemical and physical properties of the metallic component.

SUMMARY OF THE INVENTION

The present invention relates to thermal interface pads which employ the combination of a liquid metal with a polymer carrier. The liquid metal may either be employed as a filler by itself or preferably as a coating or encapsulant for other fillers dispersed in the polymer carrier. The filler or filler combinations may be pretreated with octyl-triethoxysilane, or other such hydrophobic surfactants, to aid in binding the surface oxide layer of the liquid metal component resulting in enhancement of overall moisture resistance. Alternatively, the silane component is blended in the polymeric matrix. The utilization of a silane such as octyl-triethoxysilane in combination with liquid metal is disclosed in co-pending application Ser. No. 09/946,879, the substance of which is incorporated by reference herein.

The stabilized thermally conductive mechanically compliant laminate pads of the present invention employ a centrally positioned open mesh grid component comprising a grid body with generally reticulated apertures formed therein with the apertures forming passageways or vias through which portions of the loaded polymeric resin may pass. The preparation operations for the stabilized laminate pad include positioning liquid metal/particulate containing laminae on opposed major surfaces of a grid member, and through the application of heat and pressure, causing surface portions of the laminae to flow and merge, so as to create a continuum through apertures in the mesh grid. In addition to enhancement of mechanical stability, the apertures in the intermediate mesh grid accommodate the presence of percolating clusters of liquid metal coated particles as a result of extrusion of these clusters within and through apertures. These advantages are achieved without substantial reducing or compromising desirable thermal or electrical properties while facilitating handling and utility in subsequent end use production and assembly operations.

A. The Laminae Components

In accordance with the present invention, a polymeric matrix is selected, and blended with a quantity of a liquid metal or a liquid metal and particulate combination. The polymeric matrix is preferably selected from the group of compliant compositions including waxes or hot melts. Paraffin waxes, microwaxes, silicone waxes and formulations based on these may be used. Elastomers such as silicone, natural or synthetic rubber, acrylic, polyurethane, etc. may also be used. Glassy materials such as epoxy, phenolics, may also be suitable. The polymeric matrix may be a crosslinked structure or "B-staged", including those which can be crosslinked by the user through through thermal or radiative activation.

In preparing the blend with a liquid metal a high shear environment is used to break the metal into small particles. Preferably, the liquid metal comprises an alloy of indium and/or gallium, such as a gallium-indium-tin-zinc alloy, a bismuth-indium alloy or a Lin-indium-bismuth alloy. Typically a metal that is liquid at room temperature or melting at a relatively low temperature, typically below 120° C. and preferably below 60° C.

If a liquid metal and a particulate filler combination is used, a particulate such as boron nitride, alumina or aluminum nitride is initially dried, and thereafter placed in contact with a liquid metal. In order to appropriately wet the surfaces of the particulate, a mixture of dried particulate and liquid metal is subjected to a mixing operation until the particulate is uniformly coated with the liquid metal. While not absolutely necessary, it is desirable that the particulate be dry before blending with the liquid metal alloy. At this stage of mixing one obtains a thixotropic paste of liquid metal and the powder. One can also visualize the paste as a large percolating cluster.

Following the coating operation, the coated particulate is mixed with a blend of a liquid polymeric carrier material such as, for example, liquid silicone oil of a desired viscosity, and octyl-triethoxysilane. It is preferred that the liquid metal particulate be incorporated in the polymer blend at or near the packing limit. For liquid metal coated boron nitride, the packing fraction is typically between about 60% and 65% by volume coated particles, balance liquid silicone/octyl-triethoxysilane blend. At these volume fractions, one obtains mechanically compliant compounds that have excellent thermal conductivity due to high packing density. This improves heat transfer due to the creation of a pair of compliant laminae which are thereafter placed in superposed relationship on opposed surfaces of the grid, and subjected to heat and pressure to create a moderate force sufficient to cause opposed surfaces of the laminae to ooze through open zones of the gridwork and merge together as a continuum. Through the application of force, individual extruded portions of the opposed laminae pass into the grid apertures, and fuse or merge to create a stable continuum through the grid.

Other particulate such as aluminum oxide (alumina) and aluminum nitride have also been found to be useful when properly dried prior to contact with the liquid metal. Other combinations are possible with graphite and similar thermally conductive fillers. For the application of the present invention, the particle size should be such that the average cross-sectional thickness of particles is less than about 50 microns. As with boron nitride, this portion of the working formulation is subjected to a mechanical mixing operation which typically includes a vigorous or high-speed mixing step, with vigorous mixing being continued until a visually smooth paste is formed.

When incorporated into polymer/silane blend, it has been found that the addition of the liquid metal coated particulate effectively reduces overall viscosity. The mechanism involved in this alteration of viscosity is believed to be due to the reduction of viscous drag at the "effective particle"-polymer/silane interface. Although the liquid metal coating increases the sphericity of the configuration of the particulate, it also contributes to an effective "softness" of the otherwise hard particles. These two factors function in a mutually cooperative fashion so as to reduce both viscosity and modulus of the resulting composite. For this reason, therefore, it is desirable to control the quantity of liquid metal within the blend to the range of between about 10% and 90% by volume liquid metal, balance polymer resin/particulate. This property also facilitates and enhances passage of the formulation through the apertures or vias formed in the mesh grid.

It has been further found that the liquid metal coated particulate stabilizes and anchors the liquid metal into a three phase composite to prevent gross migration. The three phases are particle-liquid metal-polymer blend. By increasing the viscosity of the metallic phase, the tendency of metal droplets to migrate and coalesce into larger drops that could macroscopically separate and leak from the composite is severely retarded. In order to even further stabilize the structure, the techniques of the present invention are employed in order to enhance mechanical stability. Increased stability is achieved without interposing additional thermal interfaces along and across the entire conductivity path, any one of which increases thermal impedance or resistance. Furthermore, it has been found that the liquid coated particulate provides a Bingham-plastic like character in the resultant composite, this allowing the paste to remain static in the absence of external stress, and yet conform and/or flow easily when subjected to stress. Upon application of heat and pressure, and when liquid metal is incorporated in the range set forth above, the desirable flow characterized as "oozing" of the composite occurs through the apertures formed in the grid.

Because of the tendency to undergo liquid-to-liquid macroscopic separation, liquid metals do not typically blend well with polymer liquids, including silicones. In accordance with the present invention, however, when particulate, in particular boron nitride, is initially coated with an indium or gallium alloy, the microscopic separation phenomena is reduced, with the liquid metal being supported or retained in coated particulate form. This is believed due to the increased thixotropy of the metal phase. In addition, the coated particulate, when added to the polymer/silane blend, functions effectively to form thermal vias within the composite. In certain cases, the thermal conductivity of the particulate such as boron nitride, may even exceed that of the liquid metal per se, such as, for example, that of a eutectic alloy of indium, gallium, and tin.

B. The Grid Component

The grid is preferably a thin mesh body fabricated from a highly thermally conductive metal such as, for example, copper or aluminum, although certain non-metallic materials may be used as well. The thin grid preferably has a cross-sectional thickness of between about 0.5 mil and 10 mils, with a thickness of between about 1 and 5 mils having been found to be preferable.

The grid has an array of reticulated apertures, with the size and density of the apertures creating a grid structure which is between about 10% and 90% open, balance structural. For most purposes, a grid aperture pattern with about 50% or more open is preferred.

In the event it is found desirable to utilize a non-metallic grid, such a grid may be prepared as a woven or non-woven fabric comprising graphite, carbon or glass fibers. Alternatively, certain other polymer fibers may be employed as well. It is, of course, appropriate to utilize materials of construction which are sufficiently durable for the required application. Any such non-metallic fabric (including non-woven fabrics) would likewise be provided with a reticulated pattern of apertures. It is, of course, always desirable that when non-metallic grids are utilized, the fabric be selected as one having reasonable thermally conductive properties.

As indicated, grids may be fabricated from a fabric of filaments consisting of polyethylene terephthalate (Dacron), or a polyimide such as nylon, or the like. In connection with non-metallic mesh grids, fabric comprising graphite fibers in a reticulated pattern of 50% open may also be useful. Generally, for non-metallic mesh grids, grids having thicknesses of between about 0.5 and 10 mils with open patterns of between about 10% and 90% are useful.

C. Interface Pads Incorporating the Laminae and Grid Components

Interface pads prepared in accordance with the present invention will typically have an overall thickness of between about 0.5 mil and 10 mils, with the thickness being based upon the application of polymeric liquid metal bearing coatings to opposed surfaces of the grid. Each of the coatings preferably has a thickness ranging from between about 0.5 mil and 5 mils.

Therefore, it is a primary object of the present invention to provide an improved thermal interface pad comprising a polymeric matrix material loaded with a liquid metal or a particulate material coated with a liquid metal.

It is a further object of the present invention to provide an improved method of preparing a thermally conductive interface pad which creates a thermally conductive bridge between the opposed surfaces of a heat generating semiconductor device and a heat dissipating surface, with the thermally conductive bridge comprising a three phase composite consisting of inorganic particulate, a liquid metal, and a liquid polymer/octyl-triethoxysilane blend.

Other and further objects of the present invention will become apparent to those skilled in the art upon a study of the following specification, appended claims, and accompanying drawings.

DESCRIPTION OF THE PREFERRED EMBODIMENTS

A. The Polymer Matrix

As indicated, the polymer matrix is preferably selected from paraffin wax, microwax, and silicone waxes comprising alkyl silicones. For most purposes waxes having a melting point of about 50–60° C. have been found particularly suited for this application. It is generally desirable to utilize a polymer matrix which undergoes a phase change at a temperature of about 10° C. lower than the phase change temperature of the liquid metal alloy. For certain purposes, soft silicone polymer consisting of a reactive siloxane elastomer, acrylic syrups, epoxy resins, either crosslinked or "B-staged", polyurethane resins are found to be useful.

One silicone wax utilized in the formulations of the examples is CP-533 (M.P. of 60° C.) (Genesee Polymer of Flint, Mich.), with these materials being, of course, commercially available. A microwax employed is that material designated as "M-7332" (M.P. of 55° C.) available from Moore and Munger of Shelton, Conn. Another polymer matrix used is a one-part soft reactive silicone elastomer available from GE Toshiba Silicones of Tokyo, Japan under the trade designation TSE-3053.

B. The Silane Components

Silanes and other surface active agents including titanates, zirconates and/or assorted surface active agents are preferred to improve rheology and stability of the dispersion, and particularly for creating a hydrophobic barrier. Surface treatments with surface active agents that work well for improving rheology as well as stability of the dispersion, especially against moisture, are alkyl functional silanes, such as for example octyl triethoxy silane (OTES). Another example is methyl trimethoxy (MTMS) silane. These silanes bind to the oxides on the surface of the metal particles, creating a durable hydrophobic barrier. Additionally, these silanes compatibilize the particles with the polymer matrix and reduce particle aggregation.

C. The Particulate

While boron nitride is preferred, alumina (aluminum oxide) particulate and/or graphite may be advantageously employed. For example, a particulate of spherical symmetry, with a diameter of 3 microns and a BET surface area of $2m^2/g$. may be employed. This particulate may be blended with the liquid metal alloys and treated similarly to formulations containing boron nitride to prepare smooth coatings with tixotropic properties. Alumina has a specific gravity of 3.75 and a thermal conductivity of 21 $W-m^{-1}-K^{-1}$. Alumina may be blended with a selected polymer matrix and treated with octyl-triethoxysilane for the preparation of coatings pursuant to the present invention. For most applications, the volume of the combined particulates/liquid metal alloy will comprise between about 50% and 70% by volume of the interface, balance resin matrix. Also, for conductive particulate of lower density, such as graphite, the particulat/liquid metal alloy component may comprise an amount as low as about 40% of the overall combination when blended with the polymer matrix.

D. The Metal Alloy

Alloys which are prepared for use in the present invention having the composition and melting points as follows:

TABLE I

| Alloy | Indium (%) | Gallium (%) | Bismuth (%) | Sn (%) | Zinc (%) | Melting Point (° C.) |
|---|---|---|---|---|---|---|
| 1 | 51 | | 32.5 | 16.5 | 0 | 60 |
| 2 | 66.3 | | 33.7 | 0 | 0 | 70 |
| 3 | | | 57 | 17 | 0 | 79 |
| 4 | 52.2 | | 0 | 46 | 1.8 | 108 |
| 5 | 25 | 61 | 0 | 13 | 1 | 7 |

E. Specific Interface Compositions

The following compositions have been prepared zing Alloy 1, with numbers being by weight:

TABLE II

| | Matrix | | Alloy 1 | | 40 μm Boron Nitride | | OTES | |
|---|---|---|---|---|---|---|---|---|
| Formula | Parts by weight | Vol % | Parts by weight | Vol % | Parts by weight | Vol % | Parts by weight | Vol % |
| 1 | 100[1] | 30 | 1200 | 52 | 100 | 15 | 12 | 3 |
| 2 | 100[1] | 30 | 1800 | 67 | 0 | 0 | 10 | 3 |
| 3 | 100[2] | 32 | 1200 | 30 | 100 | 15 | 10 | 3 |

[1]silicone wax consisting of siloxane backbones with pendant alkyl chains and having a melting point of 60° C.
[2]soft silicone polymer consisting of a reactive siloxane elastomer.

Compositions designated Formulas 4 and 5 are prepared substituting Alloy 2 for Alloy 1 with comparable results. Other particulates may also be employed using alumina or graphite.

TABLE IV

| | Matrix | | Alloy 1 | | 3 μm Alumina | | OTES | |
|---|---|---|---|---|---|---|---|---|
| Formula | Parts by weight | Vol % | Parts by weight | Vol % | Parts by weight | Vol % | Parts by weight | Vol % |
| 6 | 100[1] | 30 | 1200 | 59 | 100 | 8 | 10 | 3 |

TABLE V

| | Matrix | | Alloy 1 | | Graphite | | OTES | |
|---|---|---|---|---|---|---|---|---|
| Formula | Parts by weight | Vol % | Parts by weight | Vol % | Parts by weight | Vol % | Parts by weight | Vol % |
| 7 | 100[1] | 33 | 1200 | 60 | 25 | 4 | 10 | 3 |

Interface Pad Preparation

Formula 1:

Formula 1 was applied as two coatings on opposed surfaces of a copper mesh grid having a thickness of 2 mils and a reticulated pattern of diamond apertures 70 mils long and 35 mils wide. This mesh grid had an open area of ~50%, with reasonable border margins positioned on and along the surfaces. This formulation was applied to opposed surfaces, the coatings each having a thickness of 2 mils. Following application of the coatings to opposed surfaces of the mesh grid, the assembly was pressed under a unit pressure of 1–15 psi at a temperature of approximately 125° F. Thermal performance was excellent, with the thermal conductivity of the compound being 7 W–m$^{-1}$–K$^{-1}$ and thermal impedance being less than 0.2° C.–cm$^2$–W$^{-1}$. In certain formulations and applications, where the coating is less viscous, it may be desirable to subject the coating to a preliminary cure operation until the "B" stage is reached.

Formula 2

Formula 2 was applied as two coatings on opposed surfaces of an aluminum mesh grid having a thickness of 1.5 mils and a reticulated pattern of diamond apertures 50 mils long and 25 mils wide. This mesh grid had an open area of between ~40 and 50%, with reasonable but narrow border margins positioned on and along the surfaces. This formulation was applied to opposed surfaces, the coatings each having a thickness of 2.5 mils. Following application of the coatings to opposed surfaces of the mesh grid, the assembly was pressed under a unit pressure of 10–15 psi at a temperature of approximately 125° F. Thermal performance was excellent, with the thermal conductivity of the compound being 3 W–m$^{-1}$–K$^{-1}$ and thermal impedance being less than 0.2° C.–cm$^2$–W$^{-1}$.

Other formulations may be utilized to create thermal interface pads with results substantially similar to those reported in connection with Formulas 1 and 2 above. Thermal interface pads utilizing non-metallic grids of Dacron with openings configured similarly to those of Formulas 1 and 2 have reasonable thermal performance properties.

Structures Utilizing the Present Invention

Figures 1, 1A, 2:
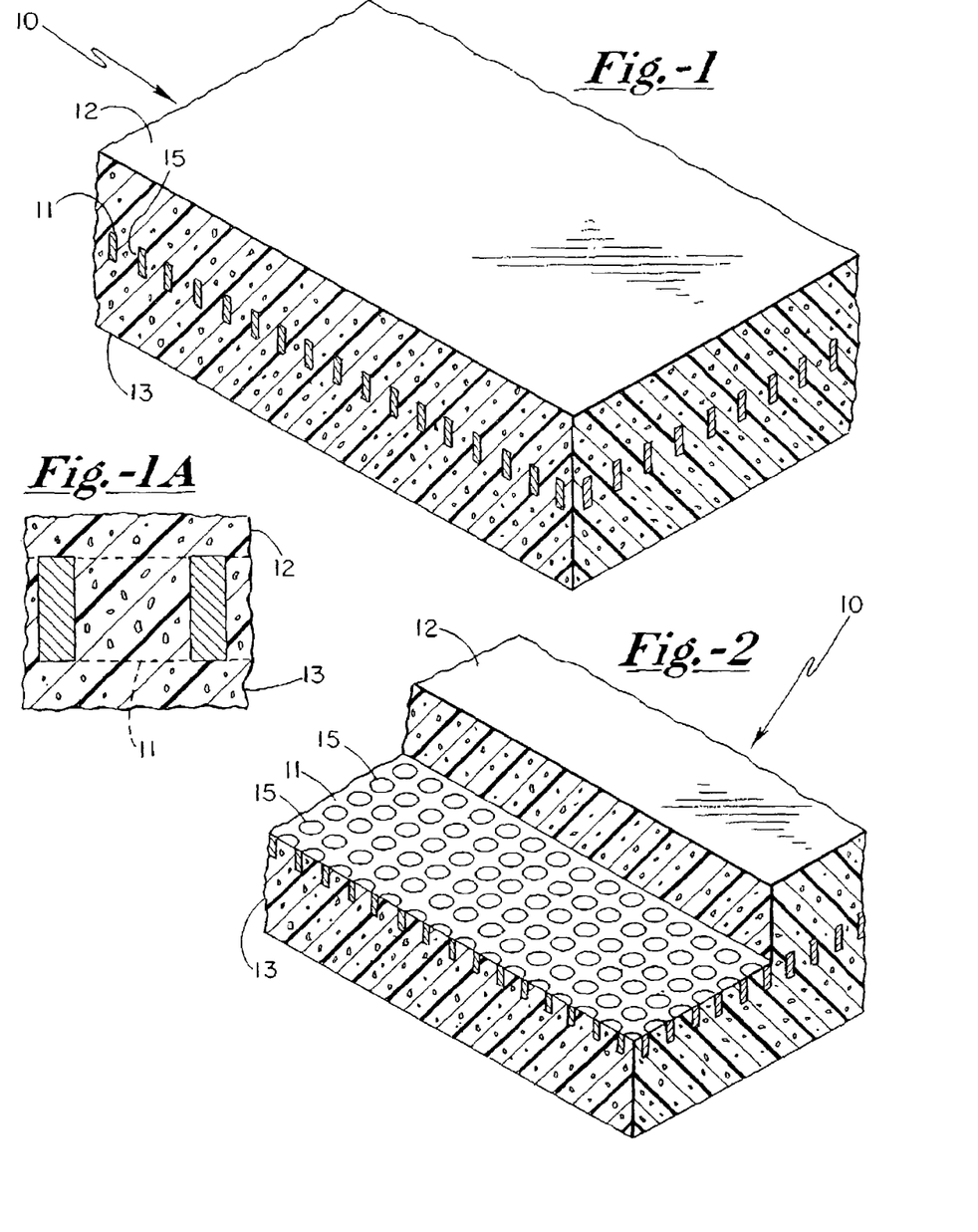
FIG. 1 is a perspective view illustrating the individual laminae and stabilizing grid arranged in accordance with the present invention.
FIG. 1A is a fragmentary sectional view on a highly enlarged scale of the individual laminae and stabilizing grid arranged in accordance with the present invention.
FIG. 2 is a view similar to FIG. 1, with certain portions of the laminae and grid having been broken away in order to more clearly illustrate the features of the present invention.
Figure 3:
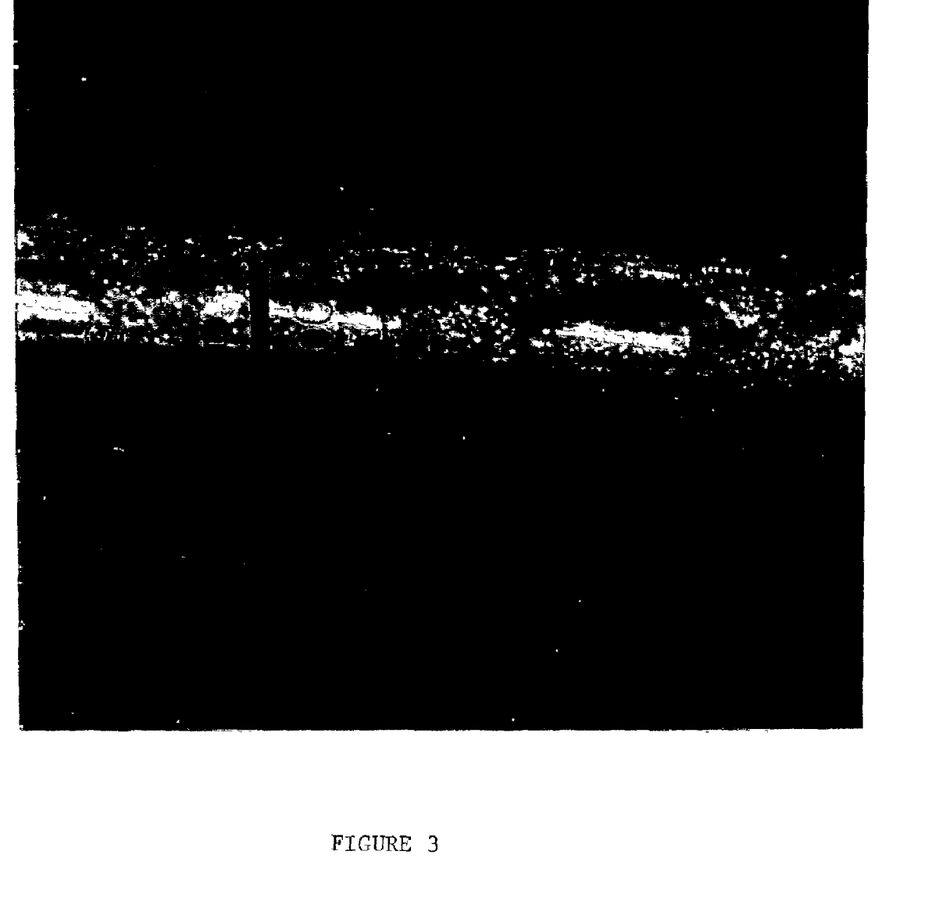
FIG. 3 is a reproduction of a photo micrograph of a cross-sectional cut-away of a thermal interface prepared and stabilized in accordance with the present invention.

With attention now being directed to FIGS. 1 and 2 of the drawings, it will be noted that interface pad generally designated 10 comprises a central grid body 11 arranged medially between coating layers 12 and 13. Further, as illustrated in FIG. 2, grid 11 is provided with reticulated apertures as at 15—15 which are sized so as to permit ingress or mutual oozing of coatings 12 and 13 until fused together and merged. Further, and as shown in the photomicrograph of FIG. 3, following fusion and merger, thermal interface pads of the present invention create and form a continuum through the mesh, thereby eliminating internal thermal interfaces in particularly in the apertures where bridging of the opposed coating occurs.

Figure 7:
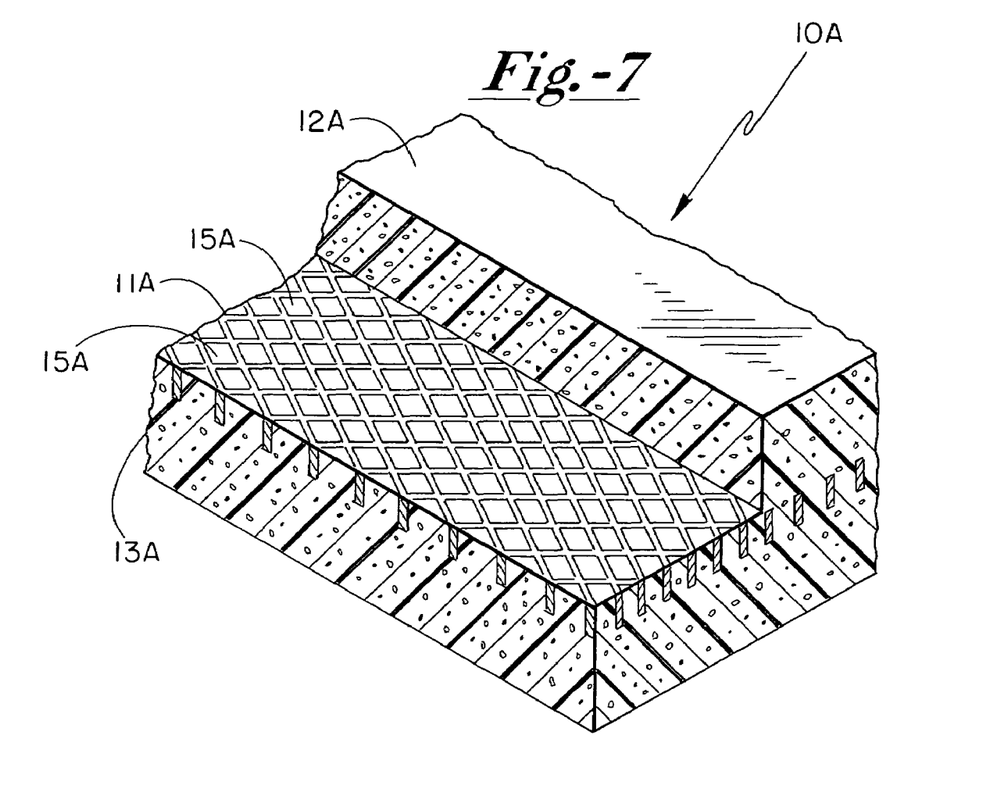
FIG. 7 is a view similar to FIG. 2 and illustrating a modified form of stabilized grid.

With attention being directed to FIG. 7 of the drawings, a modified interface pad consistent with the present invention is illustrated, having the same features as the modification illustrated in FIGS. 1–6, with the exception being that the reticulated apertures as at 15A—15A are of a different shape, specifically, a diamond-shaped configuration. The various components of FIG. 7 are the same as those shown in the embodiment of FIGS. 1–6, with these components being designated by the same reference numeral together with the suffix "A".

Figure 4:
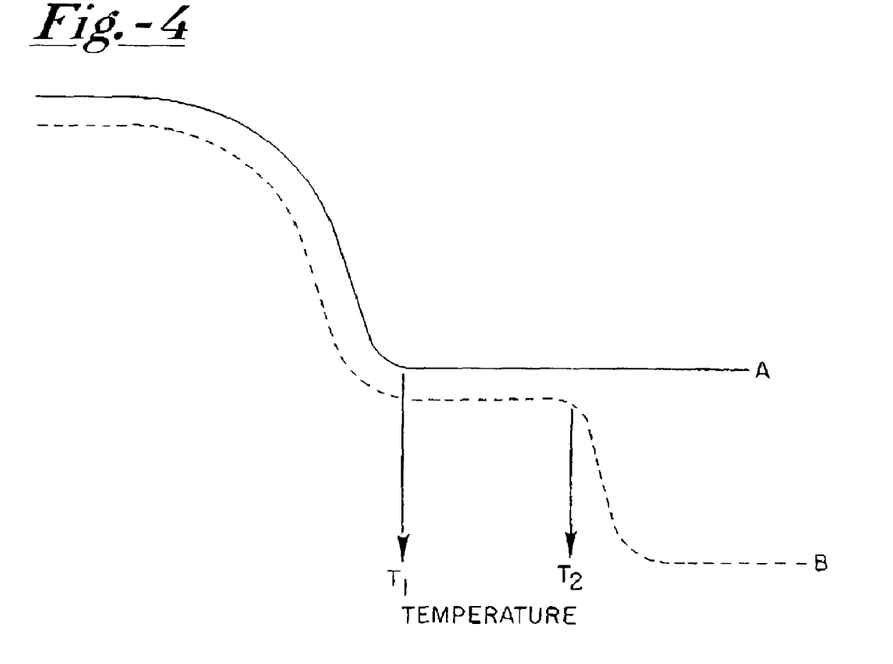
FIG. 4 is a performance graph of thermal impedance versus temperature for an interface pad fabricated and stabilized in accordance with the present invention.

With attention now being directed to FIG. 4 of the drawings, it will be noted that a phase change occurs at temperatures indicated as T1 and T2. More particularly, the materials are selected for the present invention wherein the polymeric matrix at least partially fuses or undergoes a phase change at a temperature lower than that of the liquid metal component. Given the presence of the stabilizing mesh grid, overall stability of the composite is preserved. The phase change temperature differential is preferably about 10° C.

Figure 5:
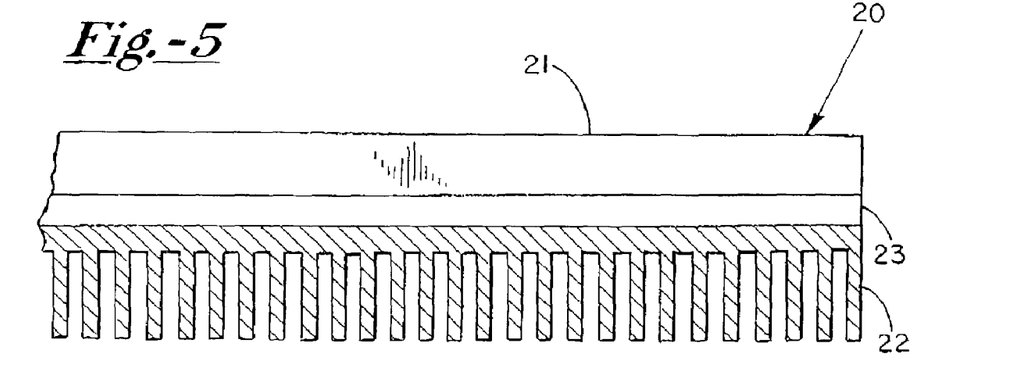
FIG. 5 is an elevational view, partially in section, of a typical assembly.
Figure 6:
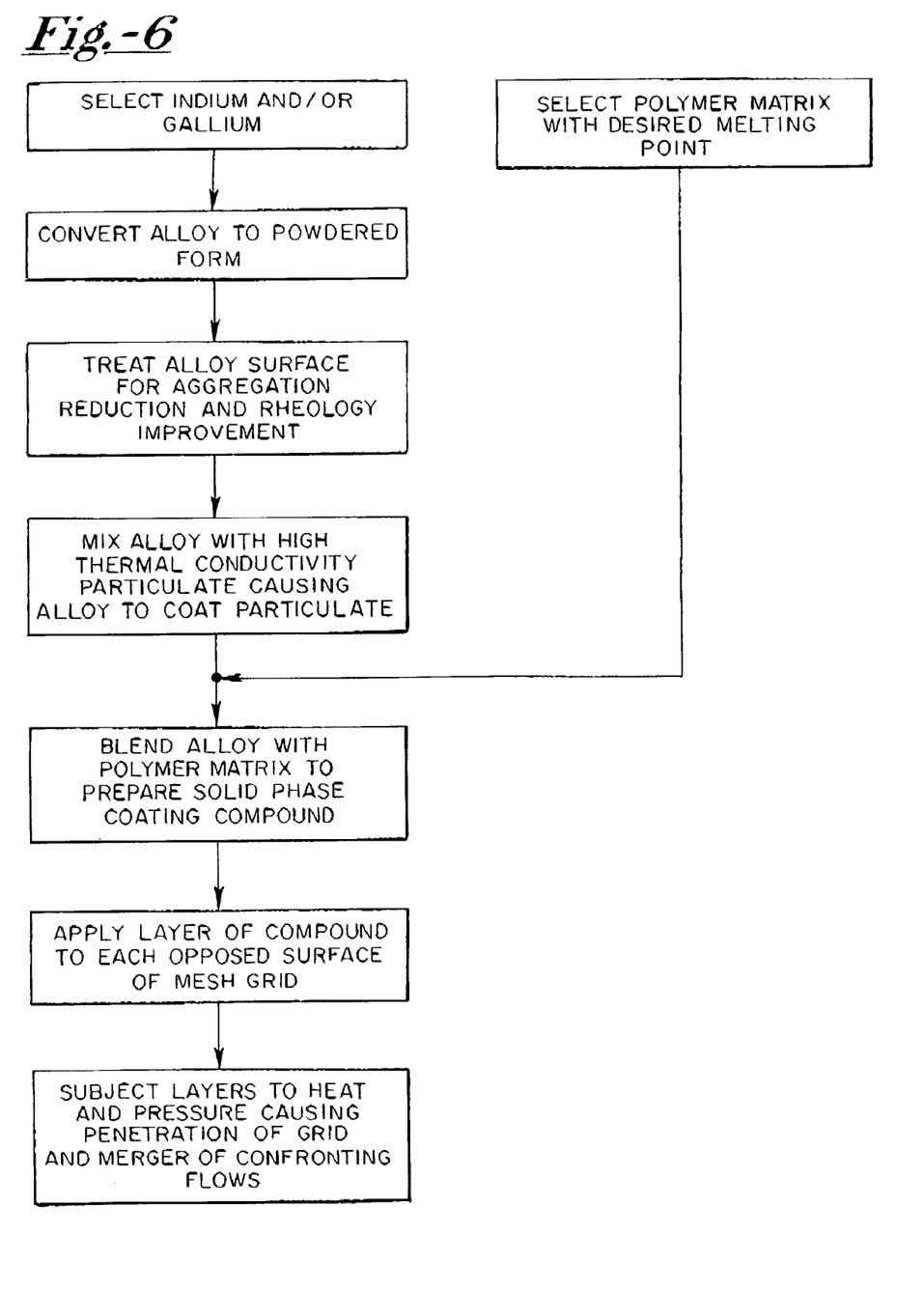
FIG. 6 is a flow chart of the steps involved in a typical operation for preparation of interface pads in accordance with the present invention.

FIG. 5 is provided to demonstrate the utilization of the compliant pad of the present invention in connection with a heat generating semiconductor device of conventional configuration. Accordingly, the assembly 10 shown in FIG. 5, includes a heat generating semiconductor device or package illustrated at 21 having a heat sink, heat spreader, or other heat dissipating member illustrated at 22. Interposed between the opposed surfaces of semiconductor device 21 and heat dissipating member 22 is a mechanically compliant stabilized thermal interface pad 23 prepared in accordance with the present invention.

General Commentary

As previously indicated, BN or alumina particulate can range in size from up to about 1 micron diameter and up to about 40 microns in cross-sectional thickness. It will be observed that the platelet-like configuration of boron nitride in particular provides a highly desirable and effective combination when wetted with liquid metal, with the effective particle being illustrated in the micrograph of FIG. 3. As indicated in FIG. 3, the individual laminae flow as a continuum through the openings formed in the grid, with the particulate, wetted with liquid metal, aiding in forming the interface-free continuum through the entire thickness of the pad. Viscosity control is aided by this feature.

Although the siloxanes described above are preferably utilized, silicone resins may also be utilized as a matrix. One such resin is designated "TSE 3053" from GE-Toshiba Silicones Inc., with these materials being, of course, commercially available. Silicones having viscosities up to about 1000 centistokes may be satisfactorily utilized. The presence of the silane modifies the viscosity slightly, producing an oil composition with slightly lower viscosities.

It will be appreciated that the above examples are given for purposes of illustration only and are not to be +otherwise construed as a limitation upon the scope of the following appended claims.

What is claimed is:

1. In a stabilized thermally conductive mechanically compliant laminate pad for interposing between opposed surfaces of a heat generating semiconductor device and a heat sink wherein the stabilized thermally conductive mechanically compliant laminate comprises upper and lower laminae on opposed surfaces of a central stabilizing apertured grid and with portions of said laminae extending through apertures in said mesh grid to form a continuum, said stabilized thermally conductive laminate being characterized in that:
   (a) said upper and lower laminae comprise a mixture of:
      (1) a polymer matrix;
      (2) a quantity of low melting indium or gallium containing alloy having a melt point at about 120° C. disbursed within said polymer matrix;
      (3) a thermally conductive particulate solid disbursed within said polymer matrix;
   (b) said stabilizing open mesh grid comprising a grid body with an array of generally reticulated apertures formed therein, and with the structure and said grid forming between about 10% and 90% of the area of said mesh grid, balance apertures;
   (c) each of said reticulated apertures having a cross-sectional dimension greater than about 0.5 mil;
   (d) said polymer matrix selected from the group consisting of hot melt waxes of paraffin and silicone, elastomers of acrylic, silicone, urethane, and flexible epoxy's, and rigid resins consisting of silicone, urethane, epoxy and phenolic polymers with each polymer matrix having a melting point ranging from between about 40° C. and 120° C.

2. The stabilizing thermally conductive mechanically compliant laminate pad of claim 1 wherein said polymer matrix is cross linked prior to being interposed between surfaces of heat generating semi-conductor device and a heat sink.

3. The stabilizing thermally conductive mechanically compliant laminate pad of claim 1 wherein said polymer matrix is mountingly interposed between opposed surfaces of a heat generating semi-conductor device and a heat sink while in the B-stage of cure, and thereafter subjected to a cross-linking operation.

4. The stabilizing thermally conductive mechanically compliant laminate pad of claim 1 wherein said alloy has a melt point between about 30° C. and 90° C.

5. The stabilizing thermally conductive mechanically compliant laminate pad of claim 1 wherein said thermally conductive particulate is selected from the group consisting of boron nitride, alumina, and graphite.

6. A method of preparing thermally conductive mechanically compliant multi-layer pads comprising the steps of:
   (a) preparing a mixture of:
      (1) a low melting metal selected from the group consisting of gallium and indium alloys, and being in the liquid state at temperatures below 120° C.; and
      (2) a thermally conductive particulate solid selected from the group consisting of boron nitride, aluminum nitride, and alumina;
   (b) mechanically blending said mixture to cause the surfaces of said particulate to become wetted with said liquid alloy to form a homogeneous thermally conductive paste wherein said liquid alloy encapsulates individual of said particles comprising said particulate;
   (c) combining said thermally conductive paste with a quantity of a flowable plastic resin material selected from the group consisting of a silicone wax having a siloxane backbone with pendent alkyl chains, and soft silicone polymers consisting of a reactive elastomer to form a thermally conductive mass, with said thermally conductive mass comprising from between about 10% and 90% by volume of metal coated particulate, balance flowable plastic resin blend;
   (d) applying said thermally conductive mass to opposed surfaces of a mesh grid having an array of reticulated apertures to form a multi-layer preform grid of between about 10% and 90% open; and
   (e) subjecting said preform to pressure sufficient to cause said oppositely disposed coatings to pass through said reticulated apertures to merge and form a continuum.

* * * * *